United States Patent [19]

Frick

[11] Patent Number: 5,629,654

[45] Date of Patent: May 13, 1997

[54] COPLANAR WAVEGUIDE COUPLER

[75] Inventor: Eric A. Frick, Mountain View, Calif.

[73] Assignee: Watkins-Johnson Company, Palo Alto, Calif.

[21] Appl. No.: 643,852

[22] Filed: May 6, 1996

[51] Int. Cl.$^6$ .................................................. H01P 5/18
[52] U.S. Cl. ............................................ 333/116; 333/238
[58] Field of Search ................................... 333/116, 238, 333/246

[56] References Cited

U.S. PATENT DOCUMENTS

| | | | |
|---|---|---|---|
| 4,482,873 | 11/1984 | Nyhus | 333/116 |
| 4,591,812 | 5/1986 | Stegens et al. | 333/116 |
| 4,675,620 | 6/1987 | Fullerton | 333/238 X |
| 5,105,171 | 4/1992 | Wen et al. | 333/116 |

OTHER PUBLICATIONS

Seiichi Banba, et al.; Multilayer MMIC Directional Couplers Using Thin Dielectric Layers; IEEE Transactions on Microwave Theory and Techniques, vol. 43, No. 6, Jun., 1995; pp. 1270–1275.

Cheng P. Wen; Coplanara Waveguide: A surface Strip Transmission Line Suitable for Nonreciprocal Gyromagnetic Device Applications; IEEE Transactions on Microwave Theory and Techniques, vol. MTT–17, No. 12, Dec., 1969, pp. 1087–1090.

Tacar Gokdemir, et al.; K/KaBand Coplanar Waveguide Directional Couplers Using a Three–Metal–Level MMCI Process; IEEE Microwave and Guided Wave Letters, vol. 6, No. 2, Feb., 1996; pp. 76–78.

Coplanar–Waveguide Directional Couplers, by Cheng P. Wen; IEEE Transactions on Microwave Theory and Techniques, vol. MTT–18, No. 6, Jun. 1970, pp. 318–322.

Interdigitated Coplanar Directional Couplers; Electronics Letters, Aug. 14, 1980, vol. 16, No. 17, pp. 645–646.

*Primary Examiner*—Paul Gensler
*Attorney, Agent, or Firm*—Flehr Hohbach Test Albritton & Herbert LLP

[57] ABSTRACT

A coplanar waveguide coupler comprises traces and waveguides, all formed on one layer of multi-layer printed wiring board with the interconnects between said waveguide coupler traces and waveguides are carried on a second layer of said board. A third layer may have a ground plane.

4 Claims, 3 Drawing Sheets

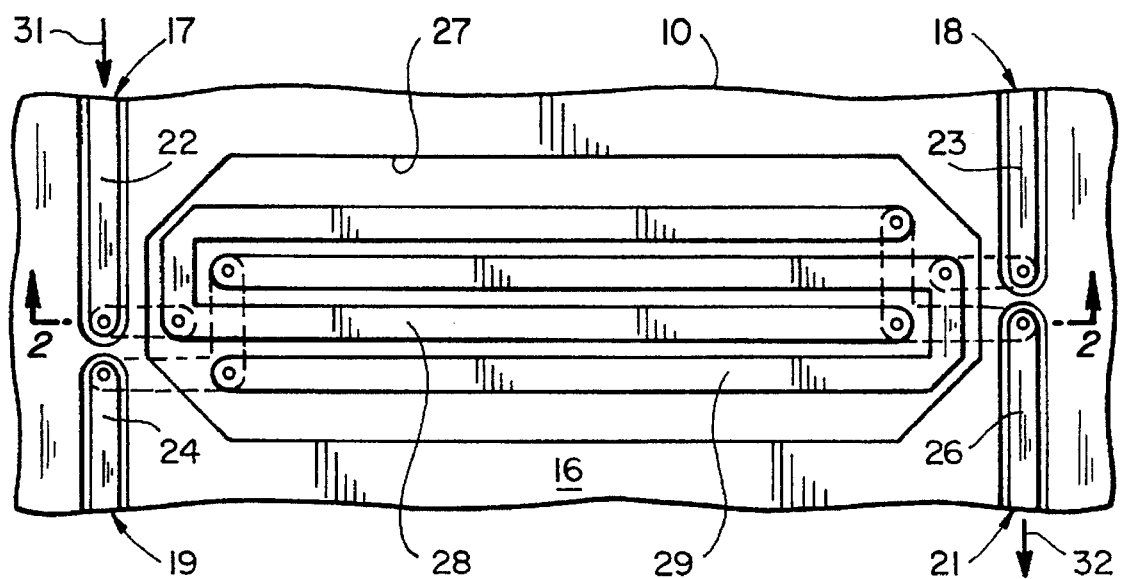
FIG_1
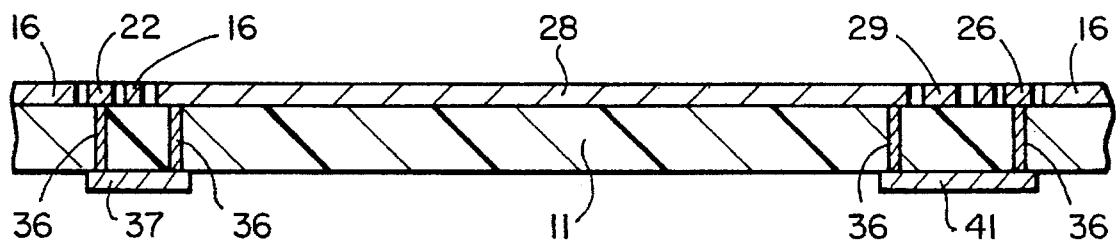
FIG_2
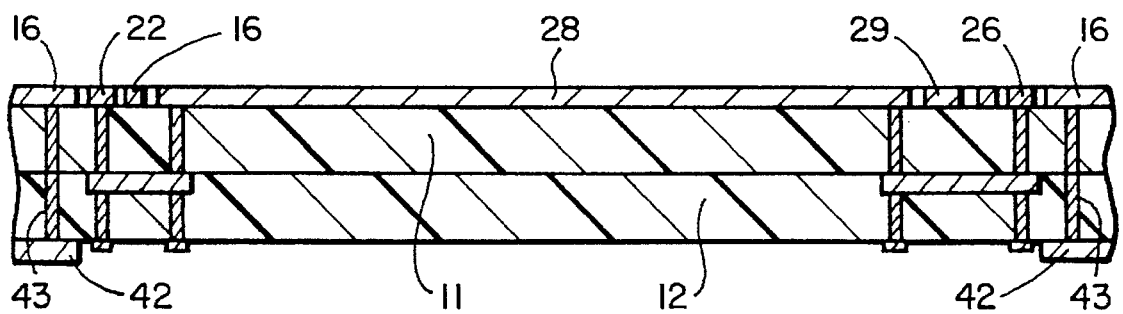
FIG_3

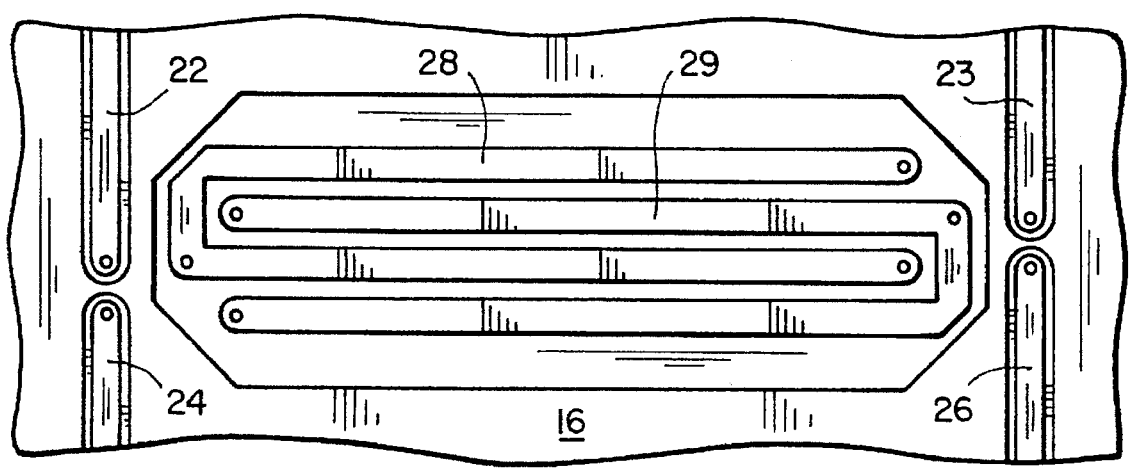
FIG_4A
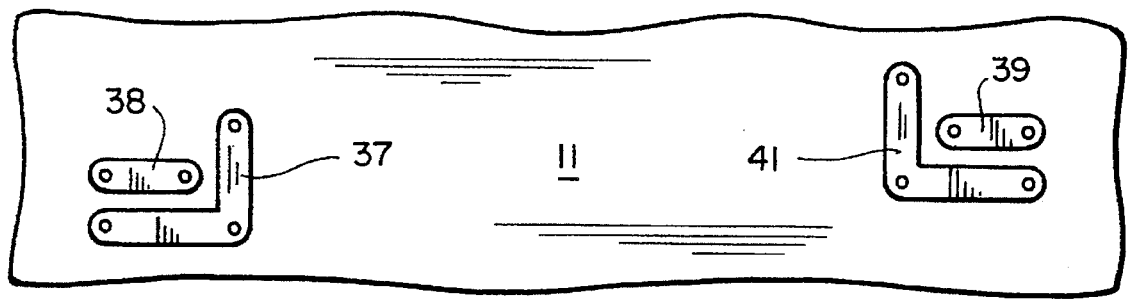
FIG_4B
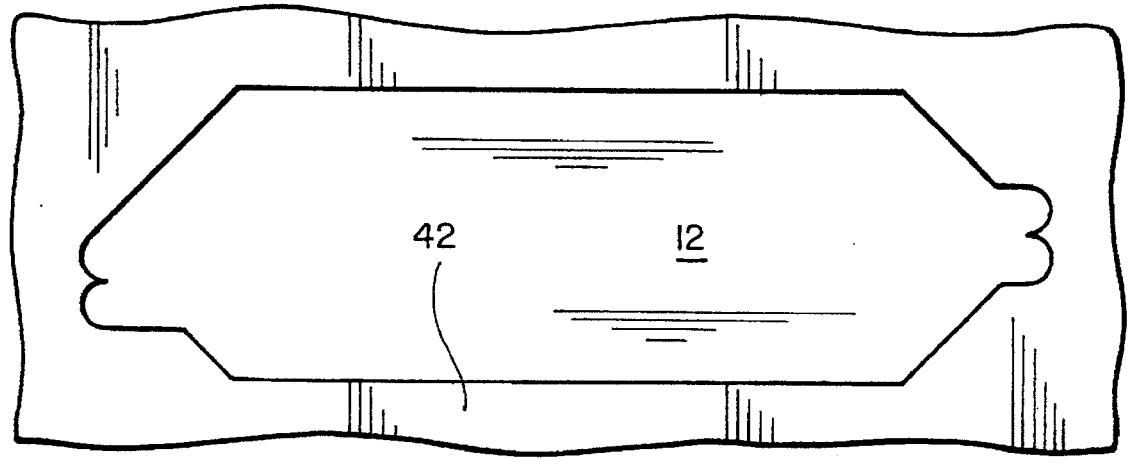
FIG_5

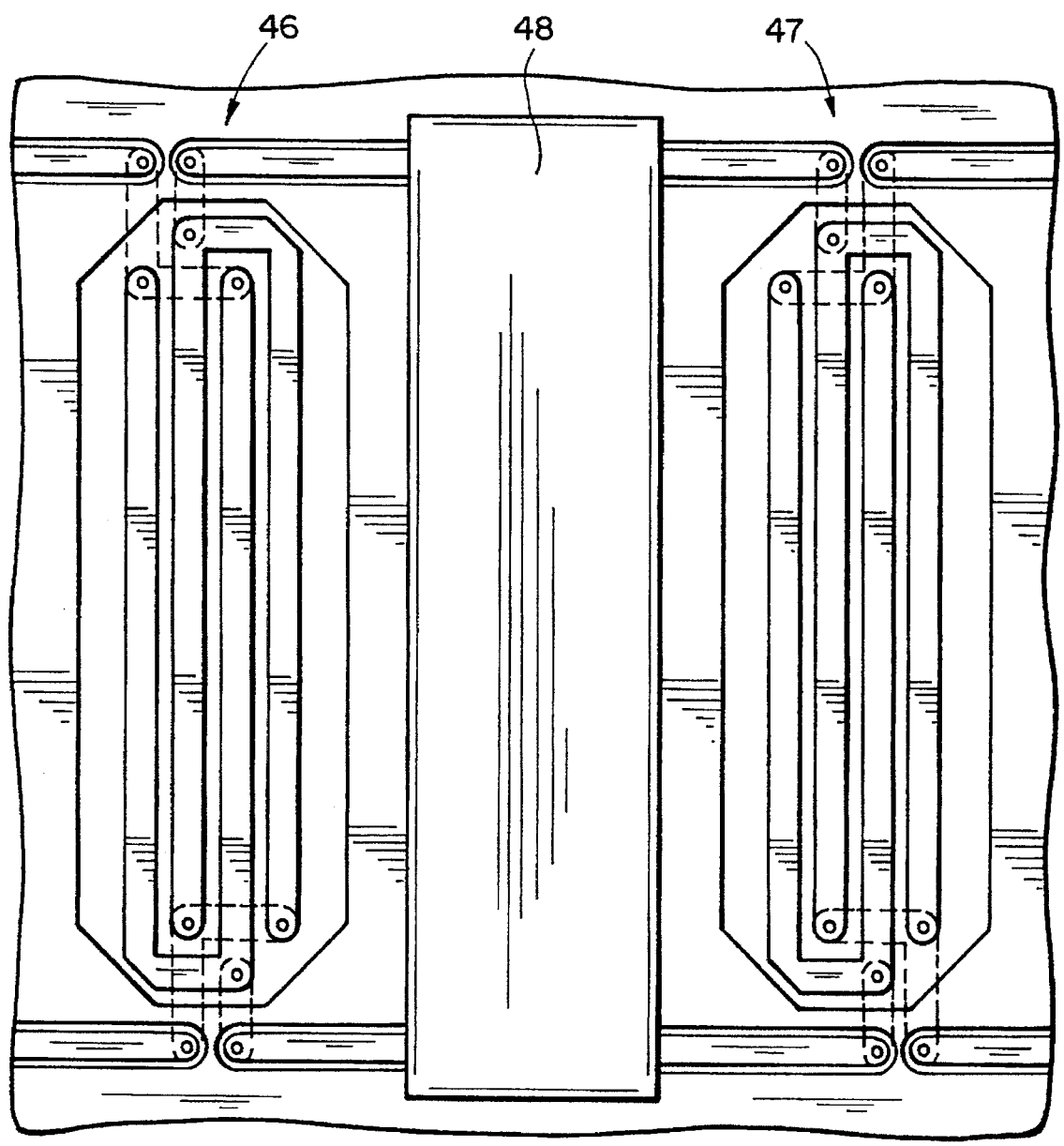
FIG_6

COPLANAR WAVEGUIDE COUPLER

BRIEF DESCRIPTION OF THE INVENTION

This invention relates generally to coplanar waveguide couplers and more particularly to a waveguide coupler formed in a multi-layer printed wiring board.

BACKGROUND OF THE INVENTION

Both coplanar waveguide (CPW) and grounded coplanar waveguide (CPWG) are ideal (superior to most commonly used microstrip) for surface mounting components whose performance benefits from minimal ground inductance and good thermal conductivity. These are the "virtues" of utilizing CPW or CPWG. A good example of such a device is a typical gallium arsenide field effect transistor (GaAs FET) for a low noise amplifier (LNA). Such high performance FETs have very high gain and are challenging if not impossible to keep stable unless the device's leads are connected to ground with minimal inductance. A power FET is another example of a typical device that would benefit from the excellent thermal characteristics of CPW. Mounting of such a device with the addition of matching and bias circuitry results in what may be referred to as a single ended CPW or CPWG component.

Often it is desirable to place two single ended components between two 90° 3dB couplers for improved return loss or higher power performance. This "balanced" design often increases the circuit complexity and cost. The addition of couplers also introduces loss at the "front end" and "back end" of the design. Coupler loss is a direct detriment to the noise figure, output power, and gain performance of the design.

One conventional implementation of the 90° couplers on PWB (printed wiring board or PCB printed circuit board) is a microstrip branch line coupler. The branch line coupler is more narrow band than the CPW coupler limiting the usefulness of the branch line coupler. One could also consider using a microstrip lange coupler. However, microstrip lange couplers require fabrication tolerances not possible using standard PWB fabrication techniques. Any such microstrip couplers would require a microstrip to CPW transition at both the input and output of the single ended component thus introducing additional loss. Packaged 90° couplers may also be purchased which may be soldered down to PWB. These couplers may be implemented a number of ways within their package. Most likely they are constructed by means of lumped or broadside coupled striplines.

An interdigitated coplanar waveguide coupler works as described by Bastida & Fanelli in Electronics Letters, Aug. 14, 1980, Volume 16, No. 17, pages 645–646. The CPW coupler described in the article features a single plane of metalization on one surface of either an alumina oxide or a gallium arsenide substrate. Bond wires are used to interconnect the coupler traces and to connect the coupler to the transmission lines. Attachment of the bond wires requires a delicate bonding step. Furthermore, the bond wires are subject to mechanical damage and once bonded, great care must be taken to avoid their damage. Bond wires, because of their small cross sectional area, are inductive which further limits the high frequency performance of the coupler. Prior art couplers are relatively expensive to manufacture.

OBJECTS AND SUMMARY OF THE INVENTION

It is an object of the present invention to provide a coplanar waveguide coupler (CPW) constructed on a multi-layer printed circuit wiring board.

It is another object of the present invention to provide a coupler which is inexpensive to manufacture.

It is another object of the present invention to provide a mechanically rugged coupler.

It is a further object of the present invention to provide a coplanar waveguide coupler which has superior electrical performance.

The foregoing and other objects of the invention are achieved by a waveguide coupler in which the coupled conductors are carried on the surface of one layer of a multi-layer printed wiring board. The conductors are interconnected by conductors carried on a second layer by the vias which extend from the first layer to the second layer. A ground plane is formed on a third layer and interconnected to a surface ground plane.

BRIEF DESCRIPTION OF THE DRAWINGS

The foregoing and other objects of the invention will be more clearly understood from the following description when read in conjunction with the accompanying drawings of which:

FIG. 1 is a plan view of a coplanar waveguide coupler in accordance with the present invention.

FIG. 2 are sectional views taken along the lines 2—2 of FIG. 1.

FIG. 3 is a sectional view of a waveguide coupler as shown in FIG. 1 showing three layers of metalization.

FIGS. 4A–4B show the steps in forming the coplanar waveguide coupler of FIGS. 1 and 2.

FIG. 5 shows the additional step of forming a ground plane in the third layer of metalization of FIG. 3.

FIG. 6 shows a pair of waveguide couplers connected by coplanar waveguide transmission lines to an active circuit.

DESCRIPTION OF PREFERRED EMBODIMENT

Referring to FIGS. 1 and 2, the coupler is formed on a multi-layer printed circuit board 10 including at a minimum two metalization layers separated by a first layer of the PWB dielectric 11. The continuous metal foil or metalization on the surface of the upper layer is photo-masked and acid etched to form the upper conductors or traces for the coupler. More particularly, the upper layer includes a ground plane 16, transmission lines 17, 18, 19 and 21. The transmission lines 17, 18, 19 and 21 are formed by thin flat conductors 22, 23, 24 and 26, respectively spaced from the ground plane 16. A window 27 is formed in the conductive foil and within the window are two U-shaped interleaved transmission lines 28 and 29. Input transmission line 17 is connected to the bottom of the U-shaped conductor or trace 28. The ends of the U-shaped transmission line 28 are connected to transmission line 21 whereby the input signal is transmitted as shown by the arrows 31 and 32. The transmission line 18 is connected to the bottom of the U-shaped trace 29 and the transmission line 19 is connected to the ends of the trace 29. Coupled 90° signal is available at the line 19 and the line 18 is isolated or terminated. Shown in dotted lines are the interconnecting elements formed on the second metalization layer as will be presently described. Connection is made between the transmission lines and the coupler lines or traces by vias 36 which extend through the layer 11 to make connection to the underlying interconnects shown generally at 37 in FIG. 2. The coupled lines or traces are preferably ¼ wavelength long and their thickness and width selected to provide both the desired impedance and power coupling.

Referring particularly to FIG. 4A, the pattern of the ground plane 16, waveguide lines 22, 23, 24 and 26 and U-shaped coupled conductors or traces formed by etching the foil on the upper surface is shown. Referring to FIG. 4B, the interconnect layers formed by masking and etching the second initialization layer are shown. Referring particularly to FIG. 1, the interconnects are shown in dotted outline. Interconnect 37 is L-shaped and connects the ends of the U-shaped trace 29 to the line 24. A linear interconnect 38 connects the bottom of the U-shaped trace 28 to line 22. Linear trace 39 connects the bottom of the U-shaped line or trace 29 to line 23 and L-shaped interconnect 41 connects the ends of the U-shaped line or trace 28 to line 26.

Referring to FIG. 3 and 5, a second layer of PWB dielectric 12 may be bonded to the first dielectric layer 11 to provide a third plane of metalization 42. The third layer of metalization 42 is ground and periodically attached to the top layer metalized ground 16 by means of grounded vias 43 extending through layers 11 and 12. This structure produces a grounded coplanar waveguide structure with excellent suppression of slot modes. Additional layers of PWB dielectric (not shown) may be bonded to the second layer of dielectric 12 with minimal change to the coupler to provide additional planes of metalization as required by any other circuits that may be fabricated on the same PWB.

It is seen that there has been provided a simple coplanar waveguide coupler with interconnections integrated into the printed circuit wiring board, eliminating the need for bond wires and the like. In summary, a first layer provides the input and output transmission lines and the coupled traces. A second layer provides the interconnect traces and a third layer provides the ground. Referring to FIG. 6, two coplanar waveguide couplers 46, 47 pursuant to the invention can be formed on a printed wiring board and provide the input and output couplers for a circuit 48 such as an amplifier, attenuator, modulator and the like.

I claim:

1. A coplanar waveguide coupler comprising:

a printed circuit board including at least a first layer of dielectric material having coupled conductive traces formed by selectively etching a first metalization layer on one surface of said first layer of dielectric material;

input and output coplanar waveguides formed by selectively etching said first metalization layer on said one surface of said first layer of dielectric material;

interconnect conductors formed by etching a second metalization first layer on the other surface of said layer of dielectric material; and, through vias connecting the interconnect conductors to the conductive traces and the coplanar waveguides.

2. A coplanar waveguide coupler as in claim 1 in which said at least first layer of dielectric material includes metalization forming a first ground plane.

3. A coplanar waveguide coupler as in claim 2 including an additional metalization layer separated from the second metalization by a second dielectric layer and etched to form a second ground plane, and vias interconnecting said first and second ground planes through said first and second dielectric layers.

4. A coplanar waveguide coupler as in claims 1, 2, or 3 which is integrated into a printed circuit wiring board with other circuit components.

* * * * *

UNITED STATES PATENT AND TRADEMARK OFFICE
CERTIFICATE OF CORRECTION

PATENT NO. : 5,629,654
DATED : May 13, 1997
INVENTOR(S) : Eric A. Frick

It is certified that error appears in the above-identified patent and that said Letters Patent is hereby corrected as shown below:

In the Drawings:

The Sheet of Drawing consisting of Figs. 1-3, should be deleted, and replaced with the attached Sheet of Drawings consisting of Figs. 1-3.

Signed and Sealed this

Twenty-fourth Day of November, 1998

Attest:

BRUCE LEHMAN

Attesting Officer

Commissioner of Patents and Trademarks

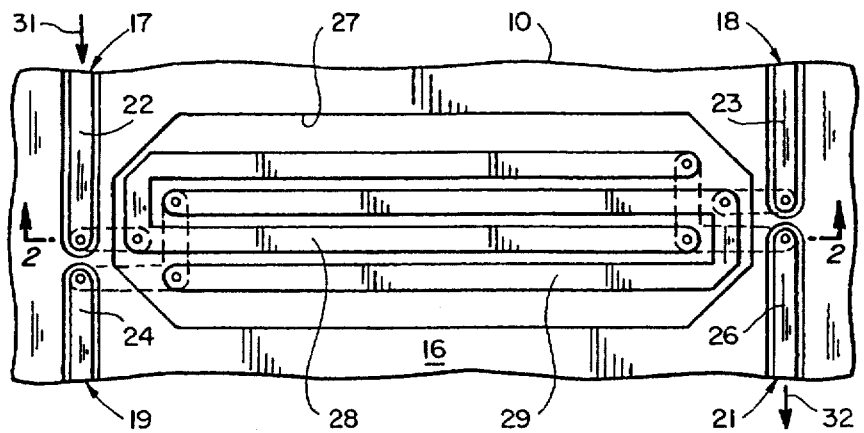
FIG_1
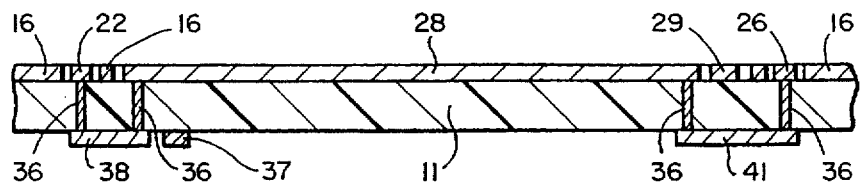
FIG_2
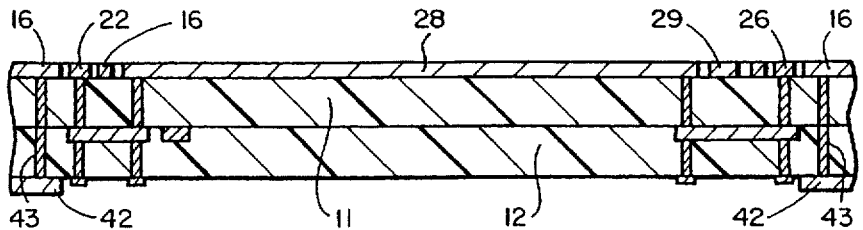
FIG_3